(12) United States Patent
Cao

(10) Patent No.: US 7,167,035 B2
(45) Date of Patent: Jan. 23, 2007

(54) DELAY CIRCUITRY AND METHOD THEREFOR

(75) Inventor: Lipeng Cao, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 47 days.

(21) Appl. No.: 11/063,070

(22) Filed: Feb. 22, 2005

(65) Prior Publication Data

US 2006/0186936 A1  Aug. 24, 2006

(51) Int. Cl.
*H03H 11/26* (2006.01)
(52) U.S. Cl. .................. 327/261; 327/264; 327/285
(58) Field of Classification Search ............... 327/158, 327/161, 231, 237, 261–264, 269–272, 285, 327/290
See application file for complete search history.

(56) References Cited

U.S. PATENT DOCUMENTS

| 4,805,195 A * | 2/1989 | Keegan ................. 375/354 |
| 5,959,487 A * | 9/1999 | Kawamura ............. 327/270 |
| 6,259,330 B1 * | 7/2001 | Arai ....................... 331/57 |
| 6,269,060 B1 * | 7/2001 | Harvey et al. .......... 369/47.28 |
| 6,414,527 B1 | 7/2002 | Seno ....................... 327/158 |
| 6,509,788 B1 | 1/2003 | Naffziger .............. 327/548 |
| 6,518,812 B1 * | 2/2003 | Sikkink et al. ......... 327/284 |
| 6,535,735 B1 | 3/2003 | Underbrink ............ 323/283 |
| 6,573,776 B1 * | 6/2003 | Miyamoto ............. 327/158 |
| 6,667,651 B1 | 12/2003 | Hashiguchi ............ 327/538 |
| 6,778,418 B1 | 8/2004 | Meguro ................. 363/165 |
| 7,009,433 B1 * | 3/2006 | Zhang et al. .......... 327/158 |
| 2004/0135605 A1 | 7/2004 | Chung et al. |

FOREIGN PATENT DOCUMENTS

EP  0976021 B1  2/2000

OTHER PUBLICATIONS

Akui et al., "Dynamic Voltage and Frequency Management for a Low-Power Embedded Microprocessor," 2004 IEEE International Solid-State Circuits Conference, 10 pgs.
Sakiyama et al., "A Lean Power Management Technique: The Lowest Power Consumption for the Given Operating Speed of LSIs," 1997 Symposium on VLSI Circuits Digest of Technical Papers, pp. 99-100.
Suzuki et al., "A 300MIPS/W RISC Core Processor with Variable Supply-Voltage Scheme in Variable Threshold-Voltage CMOS," IEEE 1997 Custom Integrted Circuits Conference, pp. 587-590.

(Continued)

*Primary Examiner*—Timothy P. Callahan
*Assistant Examiner*—Hai L. Nguyen
(74) *Attorney, Agent, or Firm*—Susan C. Hill; Robert L. King

(57) ABSTRACT

One use for delay adjustment circuit (32), coarse-grain delay offset circuit (34), and fine-grain delay synthesis circuit (36) may be as part of a delay replication circuit (30) used to replicate the frequency versus voltage behavior of an integrated circuit (29). Also, a circuit (30) and method for determining optimal power and frequency metrics of integrated circuit (29) is also described. In addition, a method for determining programmable coefficients to replicate frequency and supply voltage correlation is described.

20 Claims, 10 Drawing Sheets

OTHER PUBLICATIONS

Macken et al., "FPM 15.2: A Voltage Reduction Technique for Digital Systems," 1990 IEEE International Solid-State Circuits Conference, pp. 238-239.

Schmookler et al., "Leading Zero Anticipation and Detection—A Comparison of Methods," 2001 IEEE, pp. 7-12.

Suzuki et al., "Leading-Zero Anticipatory Logic for High-Speed Floating Point Addition," IEEE Journal of Solid-State Circuits, vol. 31, No. 8 Aug. 1996, pp. 1157-1164.

Oklobdzija, "Comments on 'Leading-Zero Anticipatory Logic for High-Speed Floating Point Addition'," IEEE Journal of Solid-State Circuits, vol. 32, No. 2, Feb. 1997, p. 292.

Oklobdzija, "An Algorithmic and Novel Design of a Leading Zero Detector Circuit: Comparison with Logic Synthesis," IEEE Transactions on Very Large Scale Integration (VLSI) Systems, vol. 2, No. 1, Mar. 1994, pp. 124-128.

\* cited by examiner

DELAY SYNTHESIS RING OSCILLATOR DELAY EQUATION

OSCILLATOR PERIOD (V) = D_MX(V)+C_ADJ*D_ADJ(V)+C_OFFSET*D_OFFSET(V)+
C_LVT*D_LVT(V)+C̄_IVT*D_IVT(V)+C_HVT*D_HVT(V)

| DELAY ELEMENT | COEFFICIENT | COMMENTS |
|---|---|---|
| D_MX(V) | NONE | FIXED DELAY OF MUXES, BUFFERS, NAND GATES (FIGS. 3-6) |
| D_ADJ(V) | C_ADJ | DELAY ADJUSTMENT DURING VOLTAGE SCALING (FIG. 4) |
| D_OFFSET(V) | C_OFFSET | STAGE DELAY OF LVT GATES FOR COARSE GRAIN DELAY OFFSET (FIG. 5) |
| D_LVT(V) | C_LVT | STAGE DELAY OF LVT GATES FOR DELAY FINE TUNING (FIG. 6) |
| D_IVT(V) | C_IVT | STAGE DELAY OF IVT GATES FOR DELAY FINE TUNING (FIG. 6) |
| D_HVT(V) | C_HVT | STAGE DELAY OF HVT GATES FOR DELAY FINE TUNING (FIG. 6) |

*FIG. 7*

| STEP | VDD | INTEGRATED CIRCUIT (IC) 29 | DELAY REPLICATION CIRCUIT 30 | | |
|---|---|---|---|---|---|
| | | FREQUENCY | MUX SELECT 42 | DELAY (FIG. 10) | FREQUENCY |
| 0 | V0 | F0 | | | |
| 1 | V0 | F0 | ADD DELAY | 1/F1 | F1 |
| | V0 | F1 | ADD DELAY | 1/F1 | F1 |
| 2 | V1 | F1 | ADD DELAY | 1/F2 | F2 |
| 3 | V1 | F1 | ADD DELAY | 1/F2 | F2 |
| | V1 | F2 | ADD DELAY | 1/F2 | F2 |
| 4 | V2 | F2 | ADD DELAY | 1/F3 | F3 |
| 5 | V2 | F2 | ADD DELAY | 1/F3 | F3 |
| | V2 | F3 | ADD DELAY | 1/F3 | F3 |
| 6 | V3 | F3 | ADD DELAY | 1/F5 | F5 |
| 7 | V3 | F3 | REMOVE DELAY | 1/F5 | F5 |
| | V3 | F4 | REMOVE DELAY | 1/F4 | F4 |

*FIG. 11*

| STEP | VDD | INTEGRATED CIRCUIT (IC) 29 FREQUENCY | DELAY REPLICATION CIRCUIT 30 | | |
|---|---|---|---|---|---|
| | | | MUX SELECT 42 | DELAY (FIG. 10) | FREQUENCY |
| 0 | V0 | F0 | | | |
| 1 | V0 | F0 | ADD DELAY 2 | 1/F2 | F2 |
| | V0 | F2 | ADD DELAY 2 | 1/F2 | F2 |
| 4 | V2 | F2 | ADD DELAY 2 | 1/F6 | F6 |
| 5 | V2 | F2 | ADD DELAY | 1/F3 | F3 |
| | V2 | F3 | ADD DELAY | 1/F3 | F3 |
| 6 | V3 | F3 | ADD DELAY | 1/F5 | F5 |
| 7 | V3 | F3 | REMOVE DELAY | 1/F4 | F4 |
| | V3 | F4 | REMOVE DELAY | 1/F4 | F4 |

*FIG. 13*

DELAY CIRCUITRY AND METHOD THEREFOR

RELATED APPLICATION

This is related to the U.S. Patent Application entitled "Circuit and Method for Determining Optimal Power and Frequency Metrics of an Integrated Circuit", invented by Lipeng Cao, having filed concurrently herewith, and assigned to the current assignee hereof.

This is related to the U.S. Patent Application entitled "Method for Determining Programmable Coefficients to Replicate Frequency and Supply Voltage Correlation in an Integrated Circuit", invented by Lipeng Cao, having filed concurrently herewith, and assigned to the current assignee hereof.

FIELD OF THE INVENTION

The present invention relates in general to integrated circuits, and more particularly to the relationship between supply voltage, frequency, and power consumption in an integrated circuit.

RELATED ART

Device characteristics of ICs vary due to intrinsic IC manufacturing processing variation. As an example, the threshold voltage (Vt) of a particular transistor on an integrated circuit (IC) will vary from one IC to another IC depending upon variable parameters in the IC manufacturing process. Also, the threshold voltages of the same size transistor will vary at different physical locations on the same IC based upon the same or different variable parameters in the IC manufacturing process. Also, other characteristics of devices (e.g. transistor gate length) on an IC may be affected by variable parameters in the IC manufacturing process. As a result, ICs will vary as to the maximum operating frequency that can be obtained using a given supply voltage. The inverse or reciprocal of this maximum operating frequency is the critical path delay. Thus, the delay of these critical circuit paths on the IC determine the frequency of operation of that IC as the supply voltage is varied. Note that the critical path that determines maximum operating frequency for one range of supply voltages may be different than the critical path that determines maximum operating frequency for a second range of supply voltages.

BRIEF DESCRIPTION OF THE DRAWINGS

The present invention is illustrated by way of example and not limited by the accompanying figures, in which like references indicate similar elements, and in which:

FIG. 7 illustrates, in tabular form, linear relationships between the delays through various portions of the circuit illustrated in FIG. 3 and the binary representation of the MUX select signals 42, 44–47 of FIG. 3 in accordance with one embodiment of the present invention;

FIG. 11 illustrates, in tabular form, various characteristics of an IC and its delay replication circuit of FIG. 3 (for steps 1–7 of FIG. 10) at different operating voltages in accordance with one embodiment of the present invention;

FIG. 13 illustrates, in tabular form, various characteristics of an IC and its delay replication circuit of FIG. 3 (for steps 1, 4–7 of FIG. 12) at different operating voltages in accordance with one embodiment of the present invention.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

Figure 1:
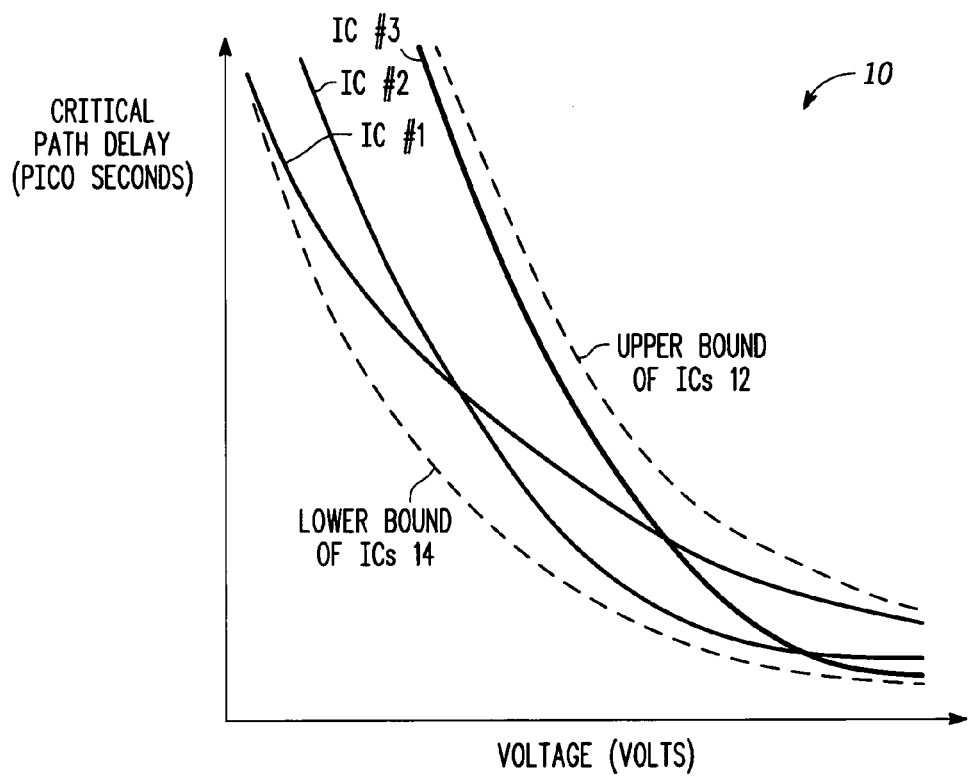
FIG. 1 illustrates, in graphical form, different critical path delay versus voltage curves for different ICs (e.g. IC#1, IC#2, and IC#3) along with upper and lower bound curves in accordance with one embodiment of the present invention.

Referring to FIG. 1, process variations will produce different critical path delay versus voltage curves for different ICs (e.g. IC#1, IC#2, and IC#3). From measurements of the critical path delay versus voltage for a set of samples of ICs, an upper bound of ICs 12 and a lower bound of ICs 14 can be determined. Even across the full range of manufacturing process variation, functional ICs will have a critical path delay versus voltage curve that falls within these upper and lower bounds 12, 14.

Figure 2:
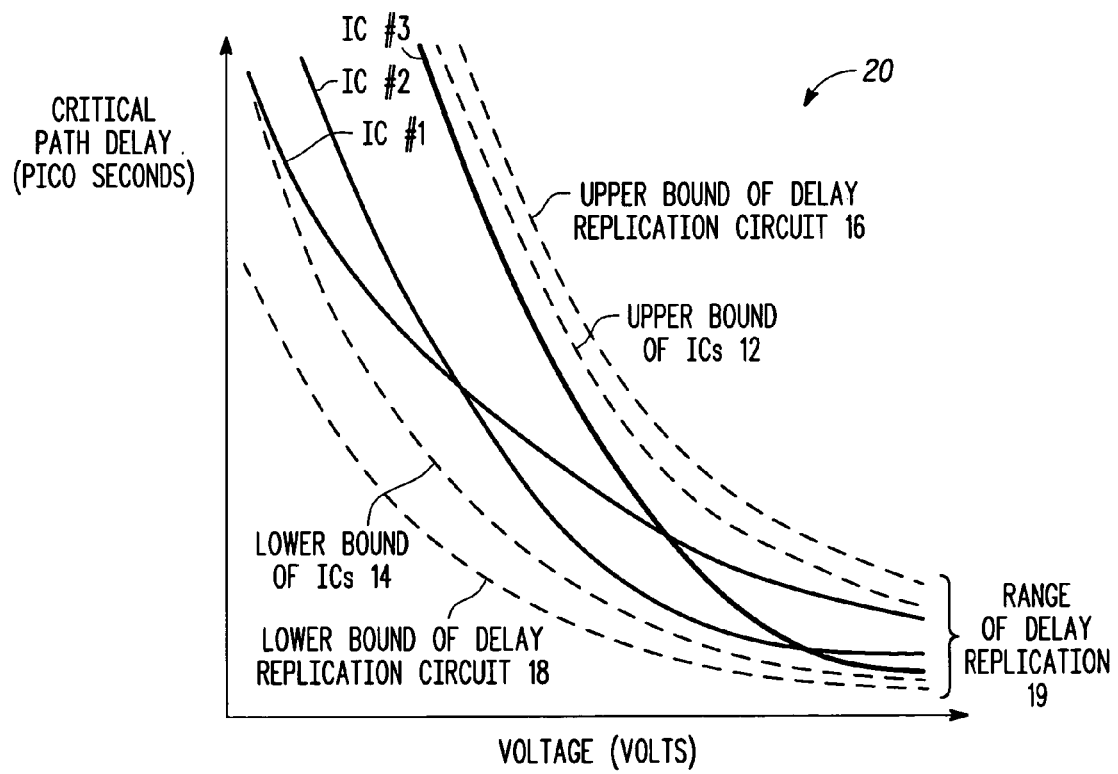
FIG. 2 illustrates, in graphical form, the curves of FIG. 1 with an additional upper bound curve and an additional lower bound curve added in accordance with one embodiment of the present invention.

Referring to FIG. 2, since it is usually very difficult, if not impracticable, to measure the delay of the actual critical paths themselves, one or more delay replication circuits are generally included on an IC during manufacturing. The purpose of a delay replication circuit is to replicate or closely mimic the actual frequency versus voltage behavior of the critical paths, and thus to replicate or mimic the actual frequency versus voltage behavior of the IC itself. Curve 16 represents the delay versus voltage behavior of a replication circuit having a first amount of delay. Curve 16 can be used as an upper bound for the actual behavior of the ICs#1, #2, and #3. Curve 18 represents for the delay versus voltage behavior of a replication circuit having a different amount of delay. Curve 18 can be used as a lower bound for the actual behavior of the ICs#1, #2, and #3. Curves 12 and 14 represent boundaries for the behavior of the actual ICs#1, #2, and #3, whereas curves 16 and 18 represent the behavior of one or more delay replication circuits. Note that the range of delay replication 19 is selected to encompass curves 12 and 14 for the illustrated embodiment.

During testing of ICs, it is common to sort the ICs by maximum frequency of operation at a predetermined voltage. The problem with this is that many ICs sorted together are able to operate at higher frequencies at the predetermined voltage, or are able to operate at the same operating frequency at lower voltages. It is valuable to be able to differentiate between the ICs sorted together in order to individually determine the frequency (or delay) versus voltage characteristics of each individual IC. By making this individual determination, an IC manufacturer may be able to charge a higher price for the ICs that operate at higher frequencies using lower voltages. The reason for this price differential is due to the strong demand for fast ICs that consume as little power as possible, especially when the ICs are used in portable devices which require batteries to provide the power.

Also, during testing of ICs, many ICs consume too much power at the predetermined voltage and the desired frequency. In the past, these ICs may have been discarded for not meeting the power consumption specification required by the customer purchasing the IC. However, many customers are able to vary the voltage used in their products (e.g. cell phones, personal digital, assistants, etc.). Thus, by determining the frequency (or delay) versus voltage characteristics of each individual IC, an IC manufacture can reclaim ICs that do not meet the power specification during testing by reducing the predetermined voltage and informing the IC customer which particular ICs need to be operated at a voltage lower than the predetermined voltage in order to meet the customer's power specification. Note that by adjusting one or both of voltage and IC operating frequency, the power consumption of the IC can be controlled in order to meet a required power consumption specification. For customers who require a target operating frequency, the voltage can be adjusted to meet the power consumption specification. For customers who vary the target operating frequency during operation of their devices, the voltage can be adjusted to reduce the power consumption of the ICs during lower frequency operation.

Figure 3:
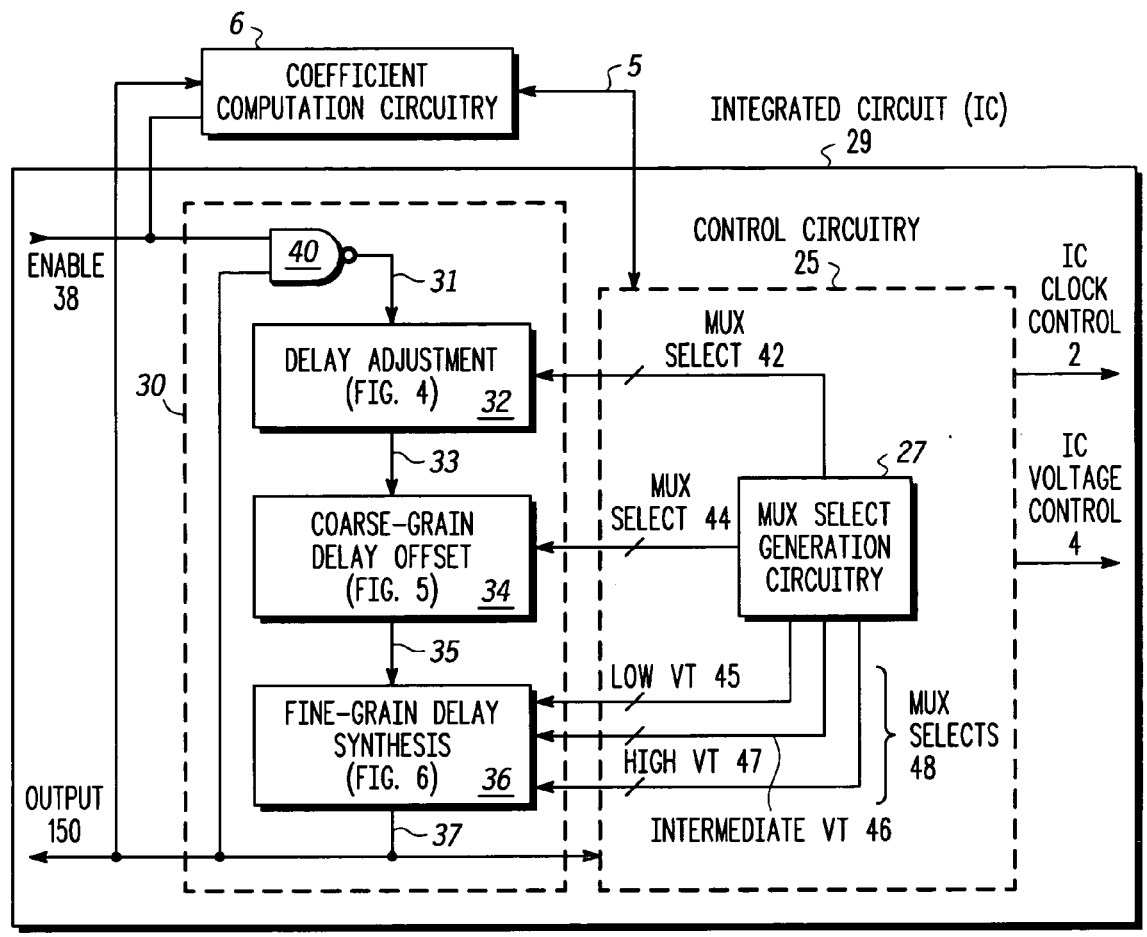
FIG. 3 illustrates, in partial block diagram and partial schematic diagram form, an integrated circuit and coefficient computation circuitry in accordance with one embodiment of the present invention.

FIG. 3 illustrates an integrated circuit 29 and coefficient computation circuitry 6. Coefficient computation circuitry 6 may be any type of circuitry and/or software capable of performing the necessary mathematical computations, such as, for example, a computer or IC testing apparatus. In alternate embodiments, coefficient computation circuitry 6 may be located on IC 29, and in addition, may take advantage of using at least some computational circuitry already located on IC 29 for other purposes.

In one embodiment, integrated circuit 29 has control circuitry 25 and a delay replication circuit 30, where the delay replication circuit 30 has a delay adjustment circuit 32, a coarse-grain delay offset circuit 34, and a fine-grain delay syntheses circuit 36. Alternate embodiments may use any one or more of circuits 32, 34, and 36 in any desired combination. In addition, different circuits other than circuits 32, 34, and 36 may be used in delay replication circuit 30 for alternate embodiments.

In the illustrated embodiment, control circuitry 25 includes MUX select generation circuitry 27 which provides MUX select signals 42 to delay adjustment circuit 32, which provides MUX select signals 44 to coarse-grain delay offset circuit 34, and which provides MUX select signals 48 to fine-grain synthesis circuit 36. In one embodiment, MUX select signals 48 include low VT MUX select signal 45, intermediate VT MUX select signal 46, and high VT MUX select signal 47. In one embodiment, control circuitry provides an IC clock control signal 2 and an IC voltage control signal 4 that may be provided to a portion of IC 29 which handles clock frequency and voltage control for the IC 29 (e.g. a power management portion of IC 29). Note that IC clock control signal 2 and IC voltage control signal 4 may alternately be provided external to IC 29, for example, if power management circuitry for IC 29 is located external to IC 29. The term MUX is used herein to represent "multiplexer".

In one embodiment, delay replication circuit 30 functions as a ring oscillator. In the illustrated embodiment, delay replication circuit 30 has a NAND gate 40 which receives an enable input 38 and which receives signal 37 from fine-grain synthesis circuit 36. The output of NAND gate 40 is coupled to an input of delay adjustment circuit 32. Signal 37 from fine-grain synthesis circuit 36 is also provided to control circuitry 25 and may also be provided external to delay replication circuit 30 as output 150. In one embodiment, output 150 may be provided to a portion of IC 29 which handles clock frequency and voltage control for the IC 29 (e.g. a power management portion of IC 29). Note that output 150 may alternately be provided external to IC 29, for example, if power management circuitry for IC 29 is located external to IC 29.

In the illustrated embodiment, coefficient computation circuitry 6 receives signal 37 and enable signal 38 as inputs. In addition, coefficient computation circuitry 6 is bi-directionally coupled to control circuitry 25 by signals 5. In one embodiment, signal 5 may be used by coefficient computation circuitry 6 to provide coefficient values to control circuitry 25 so that MUX select generation circuitry 27 can properly generate MUX select signals 42, 44, and 48. In one embodiment, enable signal 38 may merely function to allow delay replication circuit 30 to begin to function as a ring oscillator. In alternate embodiments, enable signal 38 may not be present or may serve a different purpose.

Alternate embodiments of IC 29 may include more, different, or less circuitry than that illustrated in FIG. 3. For example, alternate embodiments of control circuitry 25 may include different circuitry and MUX select signals than that illustrated in FIG. 3. The circuitry illustrated in FIG. 3 is intended for illustrative purposes only.

Still referring to the embodiment illustrated in FIG. 3, MUX select generation circuitry may include one or more circuits to store the coefficients (see FIG. 9) which may be used to derive or may directly be the binary value of the MUX select signals 42, 44–47. These storage circuit(s) may be implemented using any storage circuits, including, as examples, fuses, any type of memory, using programmable register bits (programmable one-time or multiple times), or any combination thereof.

Figure 4:
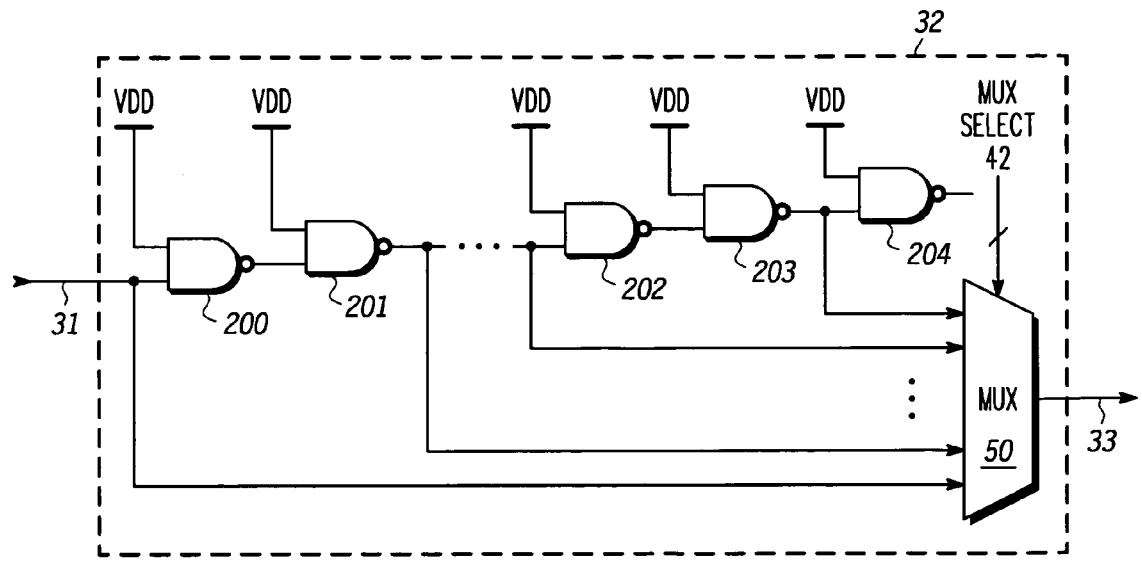
FIG. 4 illustrates, in partial block diagram and partial schematic diagram form, a delay adjustment circuit of FIG. 3 in accordance with one embodiment of the present invention.

FIG. 4 illustrates one embodiment of a delay adjustment circuit 32 of FIG. 3. In the illustrated embodiment, delay adjustment circuit 32 comprises a plurality of circuit structures (e.g. individual transistors, logic gates, interconnect, etc.) intended to have approximately the same delay characteristics. Although the embodiment illustrated in FIG. 4 uses a plurality of 2-input NAND gates 200–204 connected in series, alternate embodiments may use any type of circuit structure connected in any desired manner. In the illustrated embodiment, MUX 50 uses MUX select signals 42 to determine which NAND gate pair 200, 201 . . . or 202, 203 to provide the MUX output signal 33, or alternately whether all of the NAND gates 200–204 are bypassed. Note that alternate embodiments may use any number of NAND gate pairs. Also, alternate embodiments that do not use inverting logic may not require the gates to be used in pairs (e.g. if gates 200 and 201 were AND gates instead of NAND gates, the output of both AND gate 200 and AND gate 201 may be both be provided to MUX 50).

Figure 5:
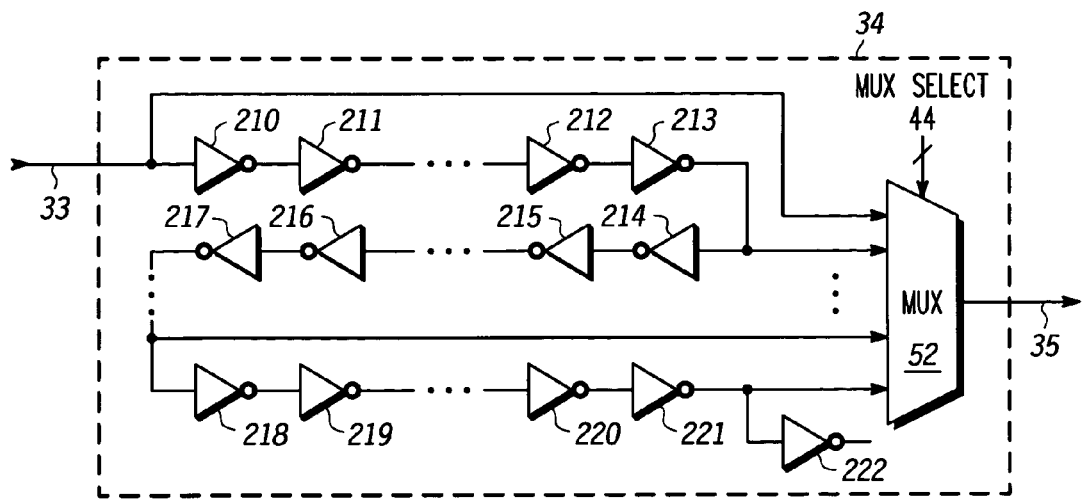
FIG. 5 illustrates, in partial block diagram and partial schematic diagram form, a coarse-grain delay offset circuit of FIG. 3 in accordance with one embodiment of the present invention.

FIG. 5 illustrates one embodiment of a coarse-grain delay offset circuit 34 of FIG. 3. In the illustrated embodiment, coarse-grain delay offset circuit 34 comprises a plurality of circuit structures (e.g. individual transistors, logic gates, interconnect, etc.) intended to have approximately the same delay characteristics. Although the embodiment illustrated in FIG. 5 uses a plurality of inverters 210–222 connected in series, alternate embodiments may use any type of circuit structure connected in any desired manner. In the illustrated embodiment, MUX 52 uses MUX select signals 44 to determine which inverter chain 210–213, 214–217 . . . or 218–221 provides the MUX output signal 35, or alternately whether all of the inverters 210–222 are bypassed. Note that alternate embodiments may use any number of inverter chains, where each inverter chain has any number of inverters. Also, alternate embodiments that do not use inverting logic may not require the inverters to be used in pairs (e.g. if gates 210 and 211 were non-inverting buffers instead of inverters, the output of both gates 210 and gate 211 may both be provided to MUX 52).

Figure 6:
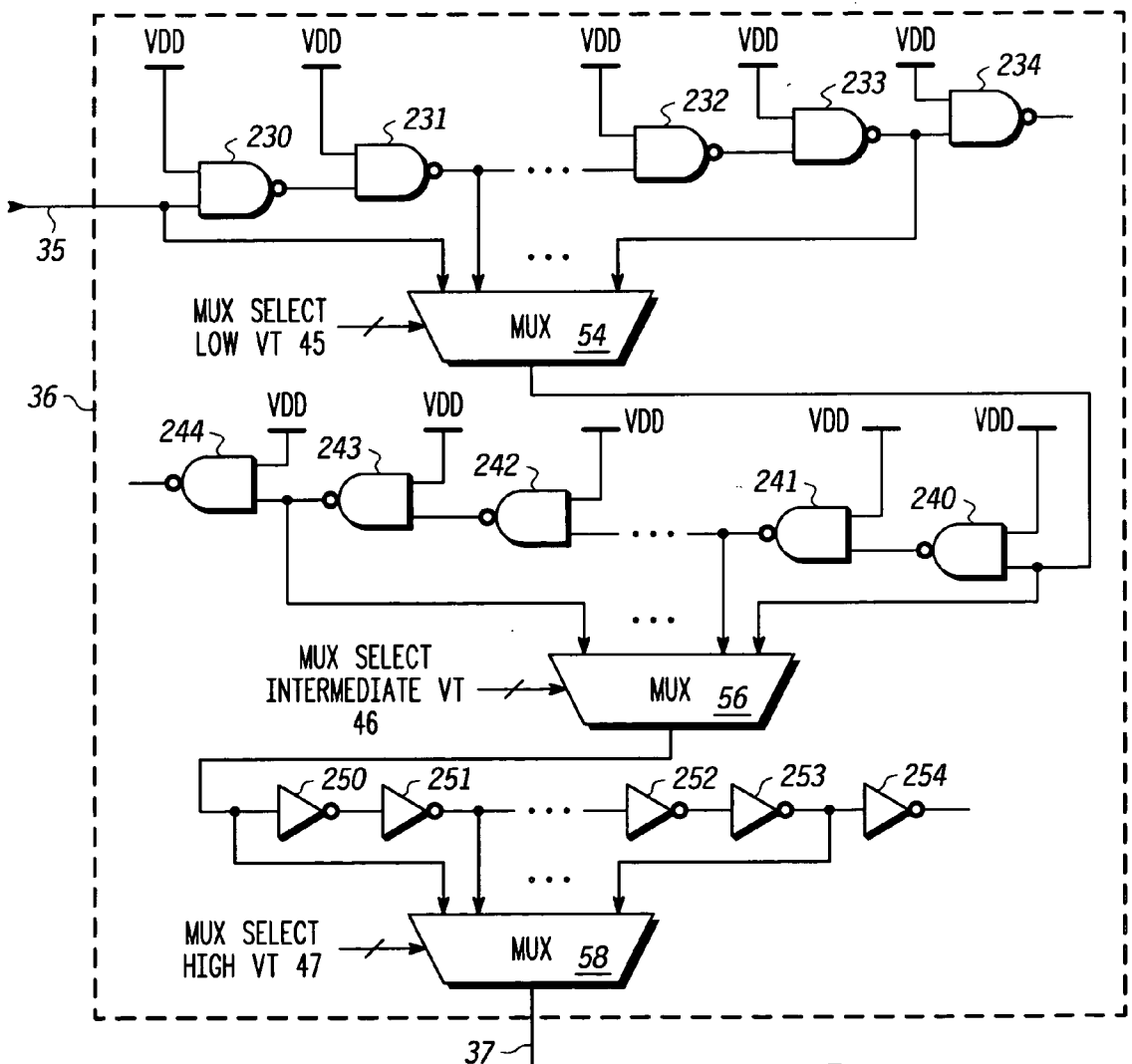
FIG. 6 illustrates, in partial block diagram and partial schematic diagram form, a fine-grain delay synthesis circuit of FIG. 3 in accordance with one embodiment of the present invention.

FIG. 6 illustrates one embodiment of a fine-grain delay synthesis circuit 36 of FIG. 3. In the illustrated embodiment, fine-grain delay synthesis circuit 36 comprises 3 groups of circuit structures (e.g. individual transistors, logic gates, interconnect, etc.), wherein each of these 3 groups of circuit structures contains one or more substantially physically and electrically identical circuit structures and provides a plurality of possible delay amount outputs, wherein each circuit structure within a group is intended to have approximately the same delay characteristics. In the illustrated embodiment, fine-grain delay synthesis circuit 36 is partitioned into three groups or portions. The first portion comprises a plurality of series connected NAND gates 230–234 comprised of transistors (not shown) having a low threshold voltage (LVT). The second portion comprises a plurality of series connected NAND gates 240–244 comprised of transistors (not shown) having an intermediate threshold voltage (IVT). The third portion comprises a plurality of series connected inverters 250–254 comprised of transistors (not shown) having a high threshold voltage (HVT). Although the illustrated embodiment shows 3 groups or portions, alternate embodiments may have any number of groups or portions. Also, in an alternate embodiment, one or more groups or portions may have only one circuit structure within that particular group or portion.

Although the embodiment illustrated in FIG. 6 uses a plurality of NAND gates 230–234, 240–244 and a plurality of inverters 250–254 connected in series, alternate embodiments may use any type of circuit structure (including, for example, transistors, logic gates, interconnect) connected in any desired manner. In the illustrated embodiment, MUXs 54, 56, and 58 use MUX select signals 45–47 to determine which gate provides the MUX output signal 37, or alternately whether all of the gates 230–234, 240–244, 250–254 are bypassed.

Alternate embodiments may use any desired number and any desired combination of LVT, IVT, and/or HVT transistors/devices for implementing the circuits illustrated in FIG. 3-6. However, by selecting certain portions of circuit 30 to be LVT, IVT, or HVT, the replication ability of delay replication circuit 30 may be improved. For example, HVT transistors may be used for NAND gates 200–204 in FIG. 4 in order to for the curves 104, 106, and 108 (see FIGS. 10 and 12) to not converge toward curve 102 as the voltage decreases. Also, for example, since the delay of LVT devices are generally less sensitive to voltage changes than IVT and HVT devices, it may be useful to use LVT devices for inverting gates 210–222 in FIG. 5. However, alternate embodiments may use any desired combination of gates having any desired combination of frequency and voltage sensitive characteristics.

In one embodiment, the transistors in the LVT portion may have a substantially same transistor threshold and may have a substantially same transistor gate length, along with a plurality of selectable taps for selecting one of plurality of delay amounts at MUX 54. Similarly, in one embodiment, the transistors in the IVT portion may have a substantially same transistor threshold and may have a substantially same transistor gate length, along with a plurality of selectable taps for selecting one of plurality of delay amounts at MUX 56. Also, in one embodiment, the transistors in the HVT portion may have a substantially same transistor threshold and may have a substantially same transistor gate length, along with a plurality of selectable taps for selecting one of plurality of delay amounts at MUX 58. In the illustrated embodiment, at least one of the transistor threshold voltage, the transistor gate length, and the type of logic gate (e.g. NAND, inverter) differs among the LVT, IVT and HVT portions. Note that the gate length of a transistor is a function of the physical gate length dimensions of that transistor. Also, note that for the embodiment illustrated in FIG. 6, the total delay for fine-grain delay synthesis circuit 36 is the delay through the LVT portion, the delay through the IVT portion, and the delay through the HVT portion added together.

MUX control signals 42, 44–47 are used to select the delay through delay replication circuit 30. Note that for the embodiment of delay replication circuit 30 illustrated in FIGS. 3–6, the total delay through this circuit (from input to NAND gate 40 to output of fine-grain delay synthesis circuit 36) has a linear relationship to the binary representation of the MUX select signals 42, 44–47. Thus, the coefficients used to determine the values of MUX select signals 44–47 may be determined using integer and linear programming mathematical techniques as illustrated in step 74 of FIG. 9. Alternate embodiment may use a non-linear relationship between the total delay through delay replication circuit 30 and the binary representation of the MUX select signals 42, 44–47; however, the calculations performed by coefficient computation circuitry 6 (see FIG. 3) may need to be derived in a different manner than illustrated in step 74 of FIG. 9.

In the illustrated embodiments, delay replication circuit 30, without any modifications, may be used to replicate the delay behavior of long interconnect conductors as well as the delay behavior of logic gates in an IC. Note, however, that the total delay through circuit 30 should maintain a linear relationship to the binary representation of the MUX select signals 42, 44–47 in order to still take advantage of the integer and linear programming mathematical techniques (see step 74 of FIG. 9). To accomplish this, interconnect segments having approximately identical topology and length can be added between each of the gates in circuits 32, 34, and 36. However, for one embodiment, it is more useful to add this interconnect delay between the gates 210–222 and MUX 52 of circuit 34 in order to better match the curve 102 to curve 100 (see FIGS. 10 and 12).

Note that any combination of either inverting or non-inverting gates may be used in the circuits illustrated in FIGS. 3–6; however, in order for circuit 30 to function as a ring oscillator, the number of inversions should be odd between the input to gate 40 (see FIG. 3) and the output of circuit 36. Although delay replication circuit 30 has been illustrated as a ring oscillator, alternate embodiments of circuit 30 may use any type of circuit which forms a delay chain.

FIG. 7 illustrates the linear relationships between the delays through various portions of the circuit illustrated in FIG. 3 and the binary representation of the MUX select signals 42, 44–47. The coefficients used to determine the binary values of MUX select signals 44–47 are listed in the second column of the table in FIG. 7. D_MX represents the delay through MUXs 50, 52, 54, 56, 58, and NAND gate 40 and any necessary buffers (not shown) which may be used to maintain signal integrity through circuit 30. D_ADJ represents the delay through a single element of delay adjustment circuit 32 (e.g. the delay through gates 200, 201 or gates 202, 203). D_OFFSET represents the delay through a single element of coarse-grain delay offset circuit 34 (e.g. the delay through gates 210–213 or gates 214–217 or gates 218–221).). D_LVT represents the delay through a single element in the first portion of fine-grain delay synthesis circuit 36 (e.g. the delay through gates 230, 231 or gates 232, 233). D_IVT represents the delay through a single element in the second portion of fine-grain delay synthesis circuit 36 (e.g. the delay through gates 240, 241 or gates 242, 243). D_HVT represents the delay through a single element in the third portion of fine-grain delay synthesis circuit 36 (e.g. the delay through gates 250, 251 or gates 252, 253).

Note that all of these delays are a function of voltage, which is represented by the notation (V); for example, D_MX(V) indicates that the delay D_MX is a function of voltage. An equation is given for the oscillator period of circuit 30. Note that varying the coefficients (C_ADJ, C_OFFSET, C_LVT, C_IVT, and C_HVT) may be used to weight the delay elements in a desire manner. In the illustrated embodiment, D_MX is a fixed or predetermined delay through circuit 30 when all gates 200–204, 210–222, 230–234, 240–244, 250–254 are bypassed. Alternate embodiments may optionally choose to apply a weighting factor for D_MX.

Figure 8:
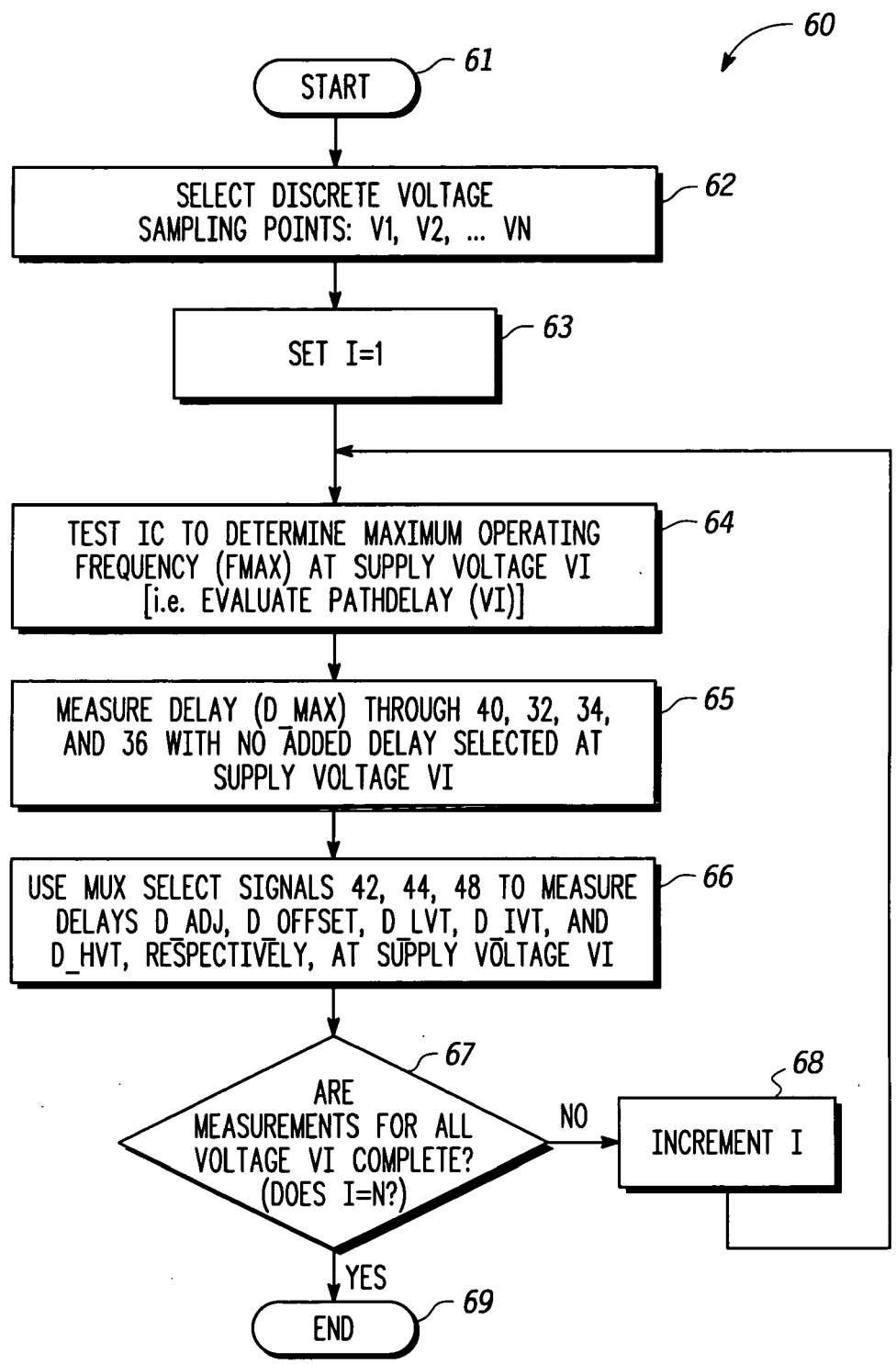
FIG. 8 illustrates, in flow diagram form, an approach that may be used to measure the actual delays (D_MX, D_ADJ, D_OFFSET, D_LVT, D_IVT, and D_HVT) and the maximum operating frequency FMAX for one integrated circuit in accordance with one embodiment of the present invention.

FIG. 8 illustrates one method that may be used to measure the actual delays (D_MX, D_ADJ, D_OFFSET, D_LVT, D_IVT, and D_HVT) and the maximum operating frequency FMAX for one integrated circuit (e.g. IC 29 in FIG. 3). Alternate embodiments may measure these actual IC delays and FMAX in any desired fashion. Standard test equipment used to test ICs may be used to perform these tests. Note that the appropriate MUX select signals 42, 44, 45–47 are used in step 66 to measure the desired delays. As an example, to measure D_MX, all of the coefficients are set to zero (e.g. MUX select signals 42, 44, 45–47 are all zeros). As another example, to measure D_ADJ, C_ADJ is non-zero and all of the other coefficients are zero. The total delay of circuit 30 will be the summation of D_MX+(C_ADJ*D_ADJ). Therefore, the delay D_ADJ=(circuit 30 delay−D_MX)/C_ADJ. All of the other delays can be computed from the measurements in a similar manner. Note that the measurements illustrated in FIG. 8 are performed on each individual IC. The coefficients (e.g. C_ADJ) used to derive the delay values may be the same for all ICs, as the coefficients here are being used merely to select the output of MUXs 50, 52, 54, 56, 58 so that delay measurements can be made.

Flow 60 illustrated in FIG. 8 starts at start oval 61. Flow 60 then proceeds to step 62 where discrete voltage sampling points V1, V2, . . . VN are selected. From step 62, flow 60 proceeds to step 63 where the variable "I" is set equal to "1". From step 63, flow 60 proceeds to step 64 where the IC is tested to determine the maximum operating frequency (FMAX) at the supply voltage VI (i.e. PATHDELAY as a function of the supply voltage VI is evaluated). Note that the path delay is the inverse of the operating frequency. From step 64, flow 60 proceeds to step 65 where the delay (D_MAX) through 40, 32, 34, and 36 are measured with no added delay selected at supply voltage VI. From step 65, flow 60 proceeds to step 66 where MUX select signals 42, 44, and 48 are used to measure delays D_ADJ, D_LVT, D_IVT, and D_HVT, respectively, at supply voltage VI. From step 66, flow 60 proceeds to decision diamond 67 where the question is asked "are measurements for all voltages VI complete (i.e. does I=N)?". If the answer to decision diamond 67 is no, I is incremented and flow 60 continues at step 64. If the answer to decision diamond 67 is yes, flow 60 continues to end oval 69 where the flow is ended for this IC.

Figure 9:
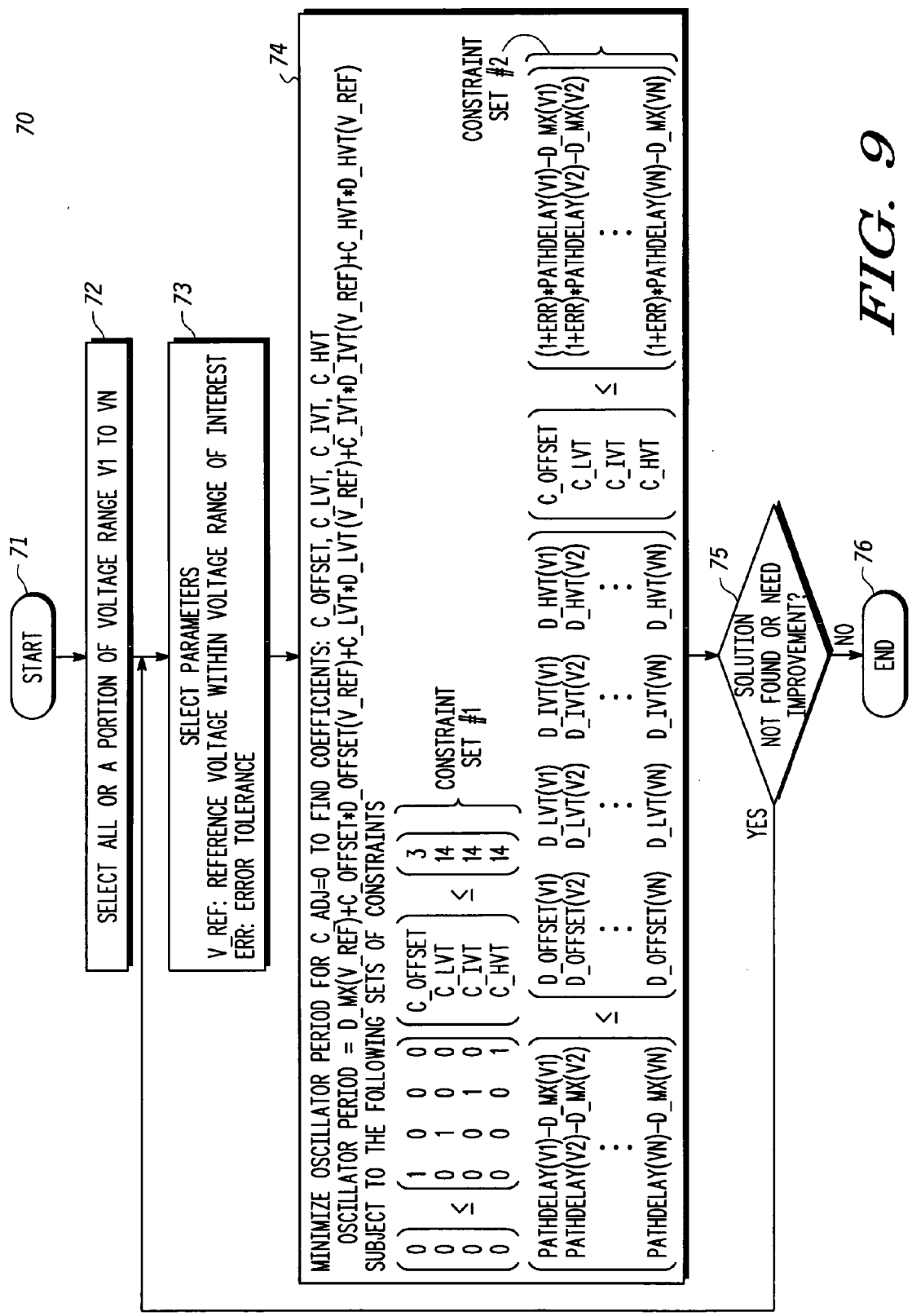
FIG. 9 illustrates, in flow diagram form, an approach that may be used to determine the values of MUX select signals 44–47 of FIG. 3 in accordance with one embodiment of the present invention.

FIG. 9 illustrates one manner in which the coefficients (C_ADJ, C_OFFSET, C_LVT, C_IVT, and C_HVT) for each IC may be computed using the delay values (D_MX, D_ADJ, D_OFFSET, D_LVT, D_IVT, and D_HVT) from that same IC. In one embodiment, the delay values for each IC may be determined from the measurements taken from that same IC (see FIG. 8).

Referring to FIG. 9, the flow 70 starts at start oval 71. The flow 70 then continues to step 72 where all or a portion of voltage range V1–VN is selected. From step 72, the flow 70 then continues to step 73 where parameters V_REF and ERR are selected. V_REF is a selected voltage which is within the voltage range of interest V1–VN. ERR is an error tolerance which is included in the computation of the coefficients in order to define an upper bound of error tolerance. Alternate embodiments may not include an error tolerance. In one embodiment, ERR may be the maximum percent difference (in decimal form) between curve 102 and curve 100 (see FIGS. 10 and 12). In this embodiment, the minimum percentage difference (in decimal form) between curve 102 and curve 100 is 0. In alternative embodiments, a lower error bound can also be defined to specify the minimum percentage difference (in decimal form) between curve 102 and curve 100. For example, curve 102 may be limited to be no more than 5% greater than curve 100 for all voltages; for this case, ERR equals 0.05. The flow 70 then continues from step 73 to step 74 where the oscillator period (for C_ADJ=0) is minimized in order to find the coefficients (C_OFFSET, C_LVT, C_IVT, and C_HVT). For this case, the oscillator period can be computed as follows.

oscillator period=$D\_MX(V\_REF)$+
 $C\_OFFSET*D\_OFFSET(V\_REF)+C\_LVT*D\_LVT(V\_REF)+C\_IVT*D(IVT(V\_REF)+C\_HVT*D\_HVT(V\_REF)$ In addition, the coefficients may be subject to one or more predetermined constraints. In the embodiment illustrated in FIG. 9, the computation of the coefficients is subject to constraint set #1 and constraint set #2. Note that the relationship between the total delay through circuit 30 (i.e. oscillator period) and the coefficients (C_OFFSET, C_LVT, C_IVT, and C_HVT) is linear, and thus integer and linear programming mathematical techniques may be used as illustrated in box 74 of FIG. 9. Note that the use of integer and linear programming mathematical techniques allows orders of magnitude efficiency improvement in determining the coefficients to be used when the number of possible combinations of coefficients is large (e.g. tens of thousands). One advantage to having a large number of possible coefficients (used to determine the MUX select signals 42, 44–47) is that the delay replication circuit 30 can be configured to more accurately replicate the actual behavior of a particular IC.

For one embodiment, constraint set #1 consists of the possible range for each of the coefficients C_OFFSET, C_LVT, C_IVT, and C_HVT. For the embodiment illustrated in FIG. 9, constraint set #1 is as follows: C_OFFSET is an integer between 0 and 3, inclusive; C_LVT is an integer between 0 and 14, inclusive; C_IVT is an integer between 0 and 14, inclusive; and C_HVT is an integer between 0 and 14, inclusive. Alternate embodiments may use different ranges.

For one embodiment, constraint set #2 ensures that the delay of delay replication circuit 30 is always equal to or greater than the critical path delay of the IC (i.e. 1/FMAX). In addition, the delay of delay replication circuit 30 is less than or equal to an upper bound, where the upper bound is defined as the critical path delay of the IC (i.e. 1/FMAX) plus an error factor which is a function of the error tolerance ERR. In alternative embodiments, constraint set #2 can specify an additional lower bound for the difference between the delay of delay replication circuit 30 and the critical path delay of the IC (i.e. 1/FMAX). In other words, in alternative embodiments, constraint set #2 may require that the delay of delay replication circuit 30 is always equal to or less than the critical path delay of the IC plus a first error tolerance ERR (as the upper bound), and the delay of delay replication circuit 30 is equal to or greater than the critical path delay of the IC plus a second error tolerance ERR2 (as the lower bound), where ERR is greater than ERR2. Alternate embodiments may not use an error tolerance, or may alternately use one or more error tolerances in any desired manner.

From step 74, the flow then continues to decision diamond 75 where the question is asked: "has a solution not been found or does the solution need improvement?". If the answer to decision diamond 75 is yes, the flow 70 returns to step 73. If the answer to decision diamond 75 is no, the flow 70 continues to oval 76 where the flow ends.

Note that when end oval 76 has been reached, the coefficients (C_OFFSET, C_LVT, C_IVT, and C_HVT) for an IC have now been computed using the delay values (D_MX, D_OFFSET, D_LVT, D_IVT, and D_HVT) from that same IC. These coefficients may then be used to determine the MUX select signals 44–47 to produce a curve 102 (see FIGS. 10 and 12). In the illustrated embodiment, the binary value of C_OFFSET is the value of MUX select signal 44, the binary value of C_LVT is the value of MUX select signal 45, the binary value of C_IVT is the value of MUX select signal 46, and the binary value of C_HVT is the value of MUX select signal 47. Note that in alternate embodiments, MUX select signals 44–47 may each comprise any desired number of signals. Note that the number of signals in each of MUX select signals 44–47 may be used to determine the possible range for each of the coefficients C_OFFSET, C_LVT, C_IVT, and C_HVT (see constraint set #1 in step 74).

Figure 10:
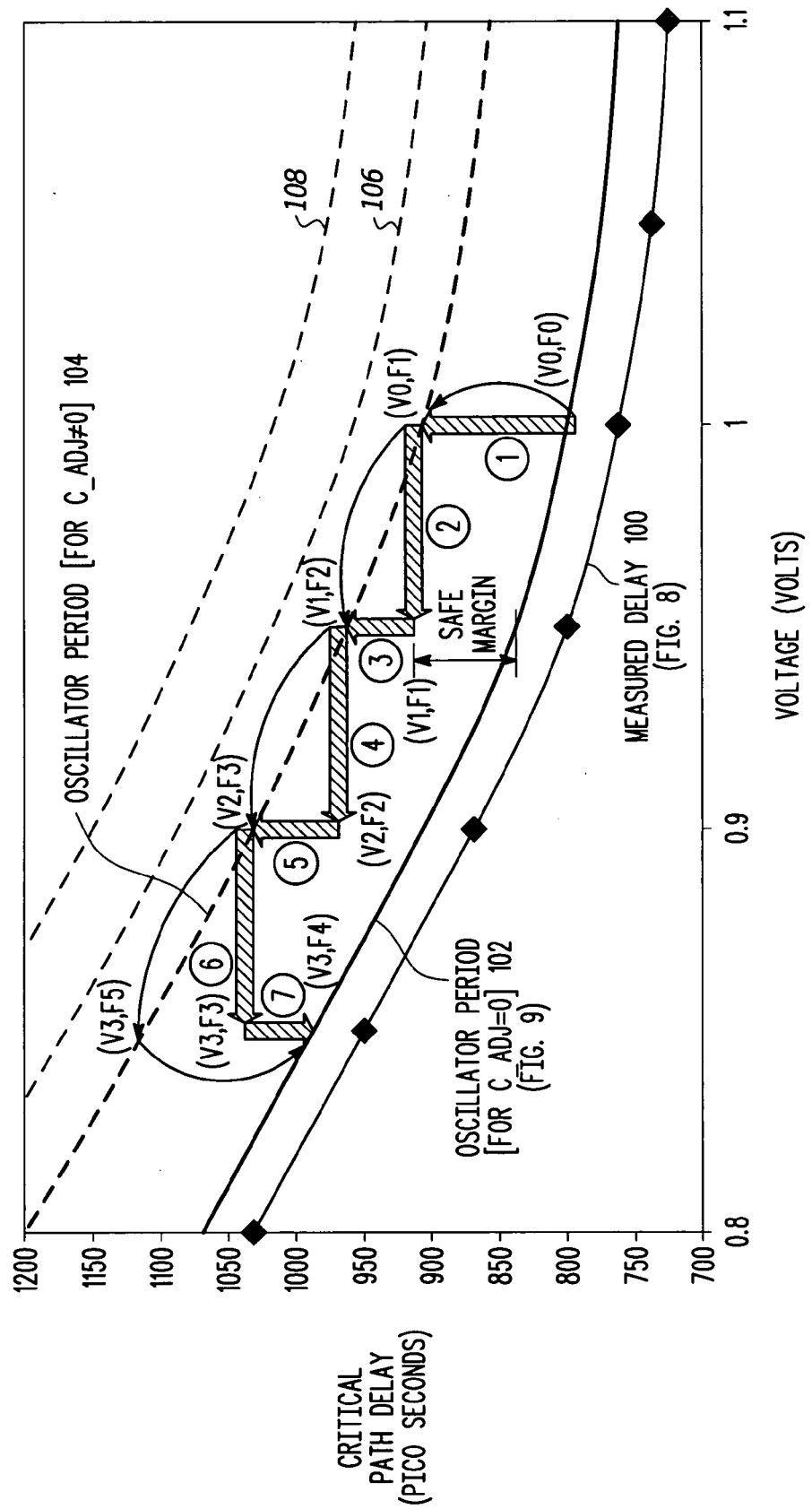
FIG. 10 illustrates, in graphical form, transition from a first optimal voltage/frequency operating point to a second optimal voltage/frequency operating point at a reduced voltage using critical path delay versus voltage curves in accordance with one embodiment of the present invention.

FIG. 10 and FIG. 11 illustrate the use of delay replication circuit 30 to assist IC 29 to transition from a first optimal voltage/frequency operating point (V0, F0) to a second optimal voltage/frequency operating point (V3, F4) with a lower voltage (i.e. V3<V0). FIG. 10 illustrates curves 100, 102, 104, 106, and 108. Curve 100, the measured delay of an IC, is equal to the reciprocal of FMAX (i.e. 1/FMAX). The FMAX of the IC was measured in step 64 of flow 60 (see FIG. 8). Curve 102 represents the oscillator period (i.e. the total delay through delay replication circuit 30) where C_ADJ=0, and where the remaining coefficients (C_OFFSET, C_LVT, C_IVT, and C_HVT) are set to the values calculated in flow 70 (see FIG. 9). Referring to FIGS. 3 and 4, C_ADJ=0 when all of the gates 200–204 in delay adjustment circuit 32 are bypassed.

Curves 104, 106, and 108 represent the oscillator period of curve 102, where C_ADJ no longer equals zero. Note that C_ADJ is made non-zero by no longer bypassing all of the gates 200–204 in delay adjust circuit 32. Curve 104 is determined by adding one delay element (e.g. gates 200, 201) to the delay path of circuit 32. The output of gate 201 is then selected by MUX 50 using MUX select signals 42. Curve 106 is determined by adding a plurality of delay elements (e.g. gates 200, 201, plus others not expressly shown) to the delay path of circuit 32. The input of gate 202 is then selected by MUX 50 using MUX select signals 42. Curve 108 is determined by adding a plurality of delay elements (e.g. gates 200, 201, plus others not expressly shown, plus gates 202, 203) to the delay path of circuit 32. The output of gate 203 is then selected by MUX 50 using MUX select signals 42. Note that in the illustrated embodiment, the delay adjustment circuit 32 has the effect of providing a plurality of possible curves 104, 106, 108, each of which is an offset from the curve 102 by an offset amount of delay across the entire operating voltage range.

FIG. 11 illustrates a table that describes various characteristics of IC 29 (see FIG. 3) and various characteristics of delay replication circuit 30 on that same IC 29 for step 0 through step 7 at different operating voltages of IC 29.

Referring to FIG. 10, the hashed arrows represent behavior of IC 29 (see FIG. 3), and the thin solid arrows represent behavior of delay replication circuit 30.

Referring to FIG. 11, step 0 represents the starting point where the operating voltage (VDD) of IC 29 is V0 and the operating frequency of IC 29 is F0. Referring to FIGS. 10 and 11, at the beginning of step 0, delay is added to delay replication circuit 30 (by changing the MUX select signals 42 in FIG. 4 in the illustrated embodiment). This is represented by the first line under step 1 in FIG. 11. As a result of adding this delay to the delay replication circuit 30, the oscillating frequency of circuit 30 is now equal to F1. Next, the operating frequency of IC 29 is changed to F1, as represented by the point of the arrow for step 1 in FIG. 10 and by the second line for step 1 in FIG. 11.

At the beginning of step 2, the operating voltage VDD of IC 29 is reduced to V1, while the operating frequency of IC 29 remains at F1. Note that for the illustrated embodiment, it is important that the corresponding delay of curve 102 in FIG. 10 at voltage V1 is smaller than 1/F1, the inverse of the frequency F1 at which IC 29 operates. This ensures that IC 29 operates at a lower frequency F1 than the maximum possible frequency at voltage V1. This therefore guarantees the correct functionality of IC 29 during voltage reduction from V0 to V1. This is illustrated in FIG. 10 as "SAFE MARGIN" between curve 102 and voltage/frequency point (V1, F1). It should be noted that for all subsequent voltage reduction steps illustrate in FIGS. 10–13, such a "SAFE MARGIN" is always maintained. Alternate embodiment may use different values for each "SAFE MARGIN", may use "SAFE MARGIN" in a different manner, or may not use any "SAFE MARGIN" at all. Examples of "SAFE MARGIN" are the delay margin between curve 102 and point (V2, F2), and the delay margin between curve 102 and point (V3, F3) in FIG. 10.

At the beginning of step 2, both delay replication circuit 30 and IC 29 have approximately the same voltage and the same delay. It should be noted however, at the end of step 2, delay replication circuit 30 and IC 29 only have the same voltage, but their frequencies are different (see FIG. 11, the row of step 2). IC 29 operates at the same frequency F1, and delay replication circuit produces an oscillation frequency F2 as determined by curve 104 at voltage V1 in FIG. 10. This oscillation frequency F2 associated with delay replication circuit 30 is used as reference frequency for step 3.

In step 3, the supply voltage maintains at V1, and IC 29 switches its operating frequency F1 to the reference frequency F2 generated by delay replication circuit 30 in step 2. Because step 3 reduces the operating frequency of IC 29 at the same voltage, correct operation of IC 29 is guaranteed. At the end of step 3, both IC 29 and delay replication circuit 30 operate at the same voltage V1 and the same frequency F2 (see FIGS. 10 and 11).

In step 4, the voltage (for both IC 29 and delay replication circuit 30) is reduced from V1 to V2. The operating frequency of IC 29 remains at F2 during step 4. There is a SAFE MARGIN between (V2, F2) and curve 102 in FIG. 10 to ensure IC 29 operates at a speed (F2) slower than the maximum possible frequency at V2. This ensures correct functionality of IC 29 during voltage reduction from V1 to V2. However, MUX SELECT 42 is not changed, and remains in ADD DELAY state (see FIG. 11, the row of step 4); the oscillating frequency of delay replication circuit 30 is therefore determined by curve 104 in FIG. 10. And at the end of step 4, the oscillating frequency of delay replication circuit 30 is F3, as determined by the delay (1/F3) of curve 104 at voltage V2 in FIG. 10. This frequency (F3) will be used as a reference frequency in step 5.

In step 5, the voltage maintains at V2, and IC 29 switches its operating frequency F2 to the reference frequency F3 generated by delay replication circuit 30 in step 4. Because step 5 reduces the operating frequency of IC 29 at the same voltage, correct operation of IC 29 is guaranteed. At the end of step 5, both IC 29 and delay replication circuit 30 operate at the same voltage V2 and the same frequency F3 (see FIGS. 10 and 11).

In step 6, the voltage (for both IC 29 and delay replication circuit 30) is reduced from V2 to V3. The operating frequency of IC 29 remains at F3 during step 6. There is a SAFE MARGIN between (V3, F3) and curve 102 in FIG. 10 to ensure IC 29 operates at a speed (F3) slower than the maximum possible frequency at V3. This ensures correct functionality of IC 29 during voltage reduction from V2 to V3. However, MUX SELECT 42 is not changed, and remains in ADD DELAY state (see FIG. 11, the row of step 6); the oscillating frequency of delay replication circuit 30 is therefore determined by curve 104 in FIG. 10. And at the end of step 6, the oscillating frequency of delay replication circuit 30 is F5, as determined by the delay (1/F5) of curve 104 at voltage V3 in FIG. 10. At the end of step 6, the voltage is reduced to the target value V3.

At the beginning of step 7, the supply voltage of IC 29 reaches the target values V3, but the operating frequency F3 of IC 29 is slower than the maximum possible frequency, as defined by curve 102 in FIG. 10, at voltage V3. MUX SELECT 42 is changed to "REMOVE DELAY" state (FIG. 11, first row of step 7). The delay versus voltage relationship of delay replication circuit 30 is therefore switched from curve 104 to curve 102 in FIG. 10. And, the oscillating frequency of delay replication circuit 30 becomes F4. This is determined by the corresponding delay (1/F4) of curve 102 at voltage V3 in FIG. 10. This is also illustrated in the first row of step 7 in FIG. 11. This oscillating frequency F4 of delay replication circuit 30 is then used as a reference frequency. The operating frequency of IC 29 is then switched from F3 to this reference frequency F4, as illustrated in FIGS. 10 and 11. It should be noted that during step 7, the oscillating frequency of delay replication circuit 30 increases from F5 to F4, and the operating frequency of IC 29 increases from F3 to F4.

This completes the illustration of IC 29 transitioning from a first optimal voltage/frequency operating point (V0, F0) to a second optimal voltage/frequency operating point (V3, F4) in FIGS. 10 and 11. In this illustrated transition, the delay versus voltage relationship of delay replication circuit 30 switches between curve 102 and curve 104 in FIG. 10, depending on the state of MUX SELECT 42, "REMOVE DELAY" (corresponding to curve 102 in FIG. 10) or "ADD DELAY" (corresponding to curve 104 in FIG. 10). In an alternative embodiment, MUX SELECT 42 can be used to add more delay and produce delay versus voltage relationship curves 106 and 108 in FIG. 10 of delay replication circuit 30. Curves 106 and 108, in addition to curve 104, along with curve 102 in FIG. 10 can be used for transitioning from a first optimal voltage/frequency point to a second optimal voltage/frequency having a lower voltage operating point in a similar fashion as illustrated in FIG. 10 and FIG. 11. The more delay that is added by MUX SELECT 42, the larger the voltage reduction step that is possible while maintaining the same amount of SAFE MARGIN illustrated in FIG. 10.

In the illustration of FIGS. 10 and 11, only two delay versus voltage relationship curves (curve 102 and curve 104, or curve 102 and curve 106, or curve 102 and curve 108) are used to assist the transition from a first optimal voltage/frequency operating point to a second optimal voltage/frequency operating at a reduced voltage. In another embodiment, multiple curves can be used to assist the completion of a single transition from a first optimal voltage/frequency operating point to a second optimal voltage/frequency operating at a reduced voltage. A sample illustration of using 3 curves is shown in FIGS. 12 and 13.

In FIG. 13, "REMOVE DELAY" denotes MUX SELECT 42 not adding any additional delay to delay replication circuit 30. The delay versus voltage relationship of delay replication circuit 30 corresponds to curve 102 in FIG. 12. "ADD DELAY" denotes adding a certain amount of delay by MUX SELECT 42 to the delay replication circuit 30, and the delay versus voltage relationship of delay replication circuit 30 corresponds to curve 104 in FIG. 12. "ADD DELAY 2" denotes MUX SELECT 42 adding more delay than that denoted by "ADD DELAY", and the delay versus voltage relationship of delay replication circuit 30 corresponds to curve 106 in FIG. 12.

Figure 12:
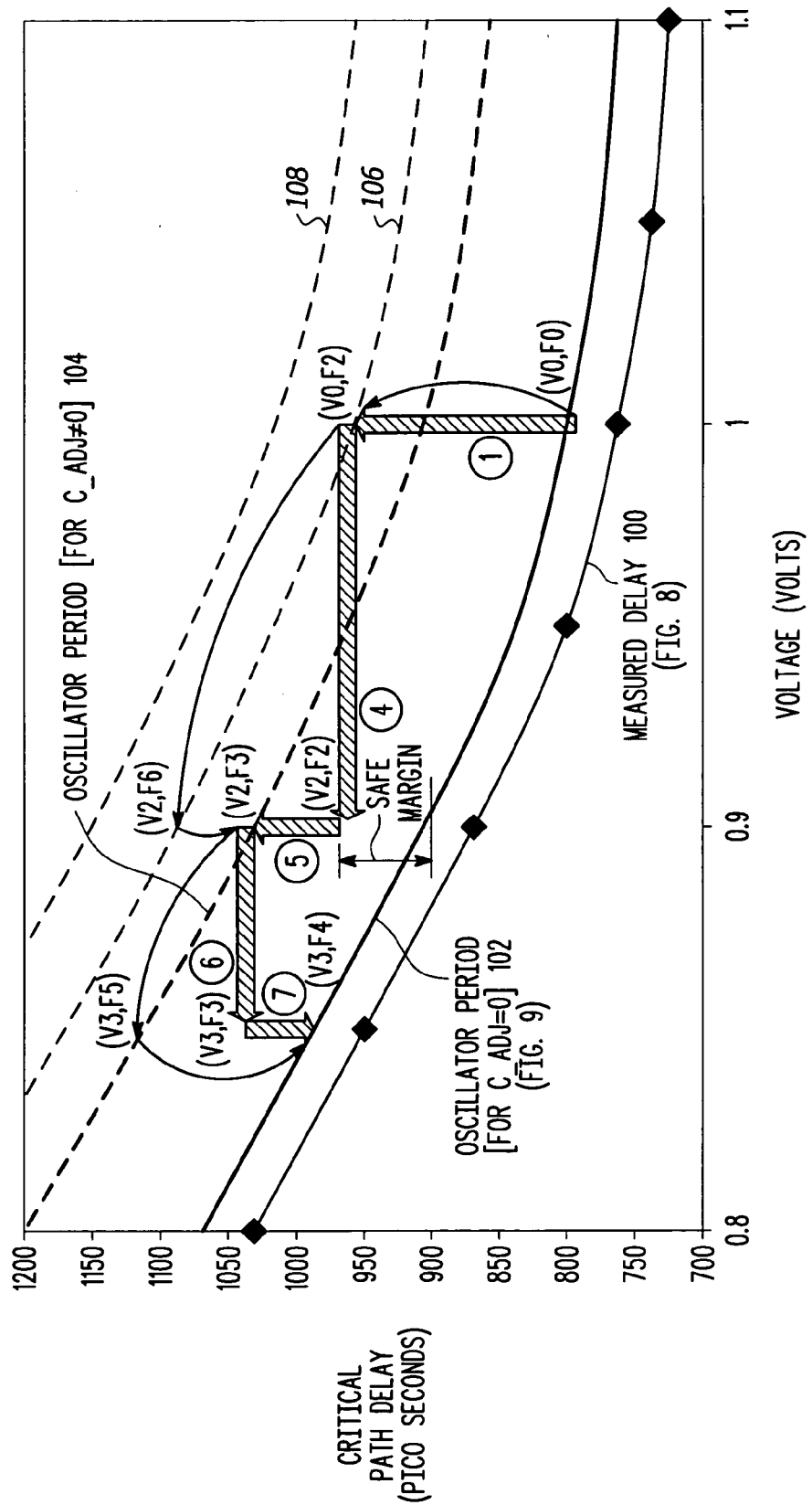
FIG. 12 illustrates, in graphical form, transition from a first optimal voltage/frequency operating point to a second optimal voltage/frequency operating point at a reduced voltage using critical path delay versus voltage curves in accordance with an alternate embodiment of the present invention.

Referring to FIG. 12, step 0 represents the starting point where the operating voltage (VDD) of IC 29 is V0 and the operating frequency of IC 29 is F0. Referring to FIGS. 12 and 13, at the beginning of step 1, delay is added to delay replication circuit 30 (by changing the MUX select signals 42 in FIG. 4 in the illustrated embodiment). This is represented by the first line under step 1 (as "ADD DELAY 2") in FIG. 13. And the delay versus voltage relationship of delay replication circuit switches from curve 102 to curve 106 in FIG. 12. The resulting oscillation frequency of delay replication circuit becomes F2 (FIG. 13, first line of step 1). This frequency F2 is used as a reference frequency. Next, IC 29 changes its frequency from F0 to this reference frequency F2 derived from delay replication circuit 30 (FIG. 13, second line of step 1). At the end of step 1, both IC 29 and delay replication circuit 30 have the same voltage and frequency operating point (V0, F2). Note that the use of an additional curve 106 allows steps 2 and 3 from FIGS. 10 and 11 to be bypassed for the approach illustrated in FIGS. 12 and 13. The bypassing of steps 2 and 3 may be an advantage for some ICs 29.

In step 4, the voltage (for both IC 29 and delay replication circuit 30) is reduced from V0 to V2. The operating frequency of IC 29 remains at F2 during step 4. There is a SAFE MARGIN between (V2, F2) and curve 102 in FIG. 10 to ensure that IC 29 operates at a speed (F2) slower than the maximum possible frequency (FMAX) at V2. This ensures correct functionality of IC 29 during voltage reduction from V0 to V2. However, MUX SELECT 42 is not changed, and remains in "ADD DELAY 2" state (see FIG. 13, step 4); the oscillating frequency of delay replication circuit 30 is therefore determined by curve 106 in FIG. 10. And at the end of step 4, the oscillating frequency of delay replication circuit 30 is F6, as determined by the delay (1/F6) of curve 106 at voltage V2 in FIG. 10.

Comparing with the illustration of FIGS. 10 and 11, a larger voltage reduction step is possible in FIGS. 12 and 13 while maintaining the same amount of "SAFE MARGIN", due to the fact that the corresponding delay is larger for curve 106 than for the delay of curve 104. As a matter of fact, steps 1 and 4 in FIGS. 12 and 13 may substitute for steps 1, 2, 3, 4 in FIGS. 10 and 11. Therefore using multiple curves resulting from adding different amount of delays by MUX SELECT 42 to delay replication circuit 30 enables a faster transition from a first optimal voltage/frequency operating point towards a second optimal voltage/frequency operating point. It should be noted that at the end of step 4, even though both IC 29 and delay replication circuit 30 have the same voltage V2, the operating frequency of IC 29 is F2, while the oscillating frequency of delay replication circuit 30 is F6 (see FIG. 13, step 4).

At the beginning of step 5, MUX SELECT 42 changes the state from "ADD DELAY 2" to "ADD DELAY", resulting in a smaller amount of delay being added to delay replication circuit 30. The delay versus voltage relationship of delay replication circuit 30 changes from curve 106 to curve 104 in FIG. 12. The oscillating frequency of delay replication circuit 30 becomes F3 (see FIG. 12, and first line of step 5 in FIG. 13), which corresponds to delay 1/F3 at voltage V2 on curve 104 in FIG. 12. This frequency F3 will be used as a reference. Next the operating frequency of IC 29 is changed from F2 to this reference frequency F3 determined by delay replication circuit 30 (see second line of step 5 in FIG. 13). At the end of step 5, both IC 29 and delay replication circuit 30 have the same voltage V2 and the same frequency F3.

In step 6, the voltage (for both IC 29 and delay replication circuit 30) is reduced from V2 to V3. The operating frequency of IC 29 remains at F3 during step 6. There is a SAFE MARGIN between (V3, F3) and curve 102 in FIG. 12 to ensure that IC 29 operates at a speed (F3) slower than the maximum possible frequency (FMAX) at V3. This ensures correct functionality of IC 29 during voltage reduction from V2 to V3. However, MUX SELECT 42 is not changed, and remains in "ADD DELAY" state (see FIG. 13, the row of step 6); the oscillating frequency of delay replication circuit 30 is therefore determined by curve 104 in FIG. 12. And, at the end of step 6, the oscillating frequency of delay replication circuit 30 is F5, as determined by the delay (1/F5) of curve 104 at voltage V3 in FIG. 12. At the end of step 6, the voltage is reduced to the target value V3.

At the beginning of step 7, the supply voltage of IC 29 reaches the target values V3, but the operating frequency F3 of IC 29 is slower than the maximum possible frequency, as defined by curve 102 in FIG. 12, at voltage V3. MUX SELECT 42 is changed to "REMOVE DELAY" state (FIG. 13, first row of step 7). The delay versus voltage relationship of delay replication circuit 30 is therefore switched from curve 104 to curve 102 in FIG. 12. And, the oscillating frequency of delay replication circuit 30 becomes F4. This is determined by the corresponding delay (1/F4) of curve 102 at voltage V3 in FIG. 12. This is also illustrated in the first row of step 7 in FIG. 13. This oscillating frequency F4 of delay replication circuit 30 is then used as a reference frequency. The operating frequency of IC 29 is then switched from F3 to this reference frequency F4, as illustrated in FIG. 12 and 13. It should be noted that during step 7, the oscillating frequency of delay replication circuit 30 increases from F5 to F4, and the operating frequency of IC 29 increases from F3 to F4.

In the foregoing specification, the invention has been described with reference to specific embodiments. However, one of ordinary skill in the art appreciates that various modifications and changes can be made without departing from the scope of the present invention as set forth in the claims below. For example, although the delay circuits 32, 34, and 36 have been illustrated as being used as part of a delay replication circuit 30, alternate embodiments may use one or more of delay circuits 32, 34, and/or 36 as part of any kind of circuit in order to provide a selectable amount of delay for any desired purpose. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

The invention claimed is:

1. A delay circuit comprising:
   a first delay portion for receiving an input signal and delaying the input signal by a first predetermined amount, the first delay portion comprising a first plurality of same-type logic gates within the first plurality comprising transistors for delaying the input signal, the transistors of the first plurality of same-type logic gates having a substantially same transistor threshold voltage and a substantially same transistor gate length; and a second delay portion coupled in series with the first delay portion for delaying the input signal by a second predetermined amount in addition to the first predetermined amount, the second delay portion comprising a second plurality of same-type logic gates within the second plurality comprising transistors for delaying the input signal, the transistors of the second plurality of same-type logic gates having a substantially same transistor threshold voltage and a substantially same transistor gate length, at least one of transistor threshold voltage, transistor gate length and type of logic gate differing between the first delay portion and the second delay portion.

2. The delay circuit of claim 1 further comprising:
a third delay portion coupled in series with the second delay portion for delaying the input signal by a third predetermined amount in addition to the first predetermined amount and the second predetermined amount, the third delay portion comprising a third plurality of same-type logic gates within the third plurality comprising transistors for delaying the input signal, the transistors of the third plurality of same-type logic gates having a substantially same transistor threshold voltage and a substantially same transistor gate length, at least one of transistor threshold voltage, transistor gate length and type of logic gate differing from each of the first delay portion and the second delay portion.

3. The delay circuit of claim 2 wherein transistor gate length dimensions of the transistors of the first plurality of same-type logic gates differ from transistor gate length dimensions of the transistors of the second plurality of same-type logic gates and transistor gate length dimensions of the transistors of the third plurality of same-type logic gates.

4. The delay circuit of claim 2 wherein the first plurality of same-type logic gates differs in logic gate function from at least one of the second plurality of same-type logic gates and the third plurality of same-type logic gates.

5. The delay circuit of claim 1 further comprising a multiplexer in each of the first delay portion and the second delay portion for selecting an amount of delay provided by each of the first delay portion and the second delay portion.

6. The delay circuit of claim 1 wherein each of the first delay portion and the second delay portion comprise a plurality of selectable taps for selecting one of a plurality of delay amounts for the first predetermined amount and the second predetermined amount in response to one or more control signals.

7. The delay circuit of claim 1 wherein the transistor threshold voltage of transistors in the first delay portion differs from the transistor threshold voltage of transistors in the second delay portion.

8. A method of delaying an input signal comprising:
receiving an input signal and delaying the input signal by a first predetermined amount by using a first plurality of same-type logic gates comprising transistors;
forming the transistors of the first plurality of logic gates to each have a substantially same first threshold voltage and a substantially same first transistor gate length;
coupling a second delay portion in series with the first delay portion for delaying the input signal by an additional second predetermined amount, the second delay portion comprising a second plurality of same-type logic gates comprising transistors; and
forming the transistors of the second plurality of same-type logic gates to each have a substantially same second threshold voltage and a substantially same second transistor gate length, at least one of logic gate type, transistor threshold voltage and transistor gate length differing between the transistors of the first plurality and the transistors of the second plurality.

9. The method of claim 8 further comprising:
coupling a third delay portion in series with the second delay portion, the third delay portion comprising a third plurality of same-type logic gates comprising transistors, the transistors of the third plurality of logic gates each having a substantially same third threshold voltage and a substantially same third transistor gate length, at least one of the third threshold voltage, the third transistor gate length or logic gate type of the third delay portion differing from transistors of first delay portion or the second delay portion; and
delaying the input signal by a third predetermined amount in addition to the first predetermined amount and the second predetermined amount.

10. The method of claim 8 further comprising:
sizing transistor gate length dimensions of the transistors of the first plurality of same-type logic gates to be different from transistor gate length dimensions of the transistors of the second plurality of same-type logic gates and transistor gate length dimensions of the transistors of the third plurality of same-type logic gates.

11. The method of claim 8 further comprising:
sizing transistor gate length dimensions of the transistors of the first plurality of same-type logic gates to be different from transistor gate length dimensions of the transistors of the second plurality of same-type logic gates.

12. The method of claim 8 further comprising:
multiplexing delay units within each of the first delay portion and the second delay portion for selecting an amount of variable delay provided by each of the first delay portion and the second delay portion.

13. The method of claim 8 further comprising:
forming a plurality of selectable taps in each of the first delay portion and the second delay portion for selecting one of a plurality of delay amounts for the first predetermined amount and the second predetermined amount in response to one or more control signals.

14. The method of claim 8 further comprising:
implementing a different logic function for the first plurality of same-type logic gates as compared to the second plurality of same-type logic gates to delay the input signal.

15. A method of delaying an input signal comprising:
receiving the input signal;
delaying the input signal by a first predetermined amount by using a first plurality of transistors forming logic gates used as delay elements and having a same logic function, each of the first plurality of transistors having a substantially equal first threshold voltage and first gate length; and
subsequently delaying the input signal by a second predetermined amount by using a second plurality of transistors, each of the second plurality of transistors forming logic gates used as delay elements and having a same second logic function, each of the second plurality of transistors having a substantially equal second threshold voltage and second gate length, wherein at least one of the first logic function, the first threshold voltage and the first gate length correspondingly differs from at least one of the second logic function, the second threshold voltage and the second gate length.

16. The method of claim 15 further comprising:
subsequently delaying the input signal by a third predetermined amount in addition to the first predetermined amount and the second predetermined amount by using a third plurality of transistors that form logic gates used as delay elements and having a third logic function, each of the third plurality of transistors having a substantially equal third threshold voltage and third gate length, wherein at least one of the third logic function, the third threshold voltage and the third gate length corresponding differs from the first and second logic functions, the first and second threshold voltages and the first and second gate lengths.

17. The method of claim 15 wherein the first threshold voltage differs from the second threshold voltage.

18. The method of claim 15 wherein the first gate length differs from the second gate length.

19. The method of claim 15 wherein the first logic function of the first plurality of transistors differs from the second logic function of the second plurality of transistors.

20. The method of claim 15 further comprising:
forming a plurality of selectable taps within each of the first plurality of transistors and the second plurality of transistors for selecting one of a plurality of delay amounts for the first predetermined amount and the second predetermined amount in response to one or more control signals.

* * * * *